(12) United States Patent
Zhang et al.

(10) Patent No.: US 9,690,434 B2
(45) Date of Patent: Jun. 27, 2017

(54) TOUCH MODULE, MANUFACTURING METHOD THEREOF AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Lei Zhang, Beijing (CN); Taofeng Xie, Beijing (CN); Lingyan Wu, Beijing (CN); Yang Liu, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

(*) Notice: Subject to any disclaimer, the term of this patent is extended or adjusted under 35 U.S.C. 154(b) by 56 days.

(21) Appl. No.: 14/443,298

(22) PCT Filed: Sep. 26, 2014

(86) PCT No.: PCT/CN2014/087596
§ 371 (c)(1),
(2) Date: May 15, 2015

(87) PCT Pub. No.: WO2015/169041
PCT Pub. Date: Nov. 12, 2015

(65) Prior Publication Data
US 2016/0299594 A1    Oct. 13, 2016

(30) Foreign Application Priority Data

May 7, 2014   (CN) .......................... 2014 1 0191600

(51) Int. Cl.
*G06F 3/044* (2006.01)
*G06F 3/041* (2006.01)
(Continued)

(52) U.S. Cl.
CPC .............. *G06F 3/044* (2013.01); *C23C 14/34* (2013.01); *C23C 14/5873* (2013.01);
(Continued)

(58) Field of Classification Search
CPC ................... G06F 3/044; G06F 3/0416; G06F 2203/04111; G06F 2203/04103; C23C 14/34; C23C 14/5873
See application file for complete search history.

(56) References Cited

U.S. PATENT DOCUMENTS

2013/0050107 A1* 2/2013 Xie .......................... G06F 3/044
345/173
2013/0162549 A1   6/2013 Kim et al.
(Continued)

FOREIGN PATENT DOCUMENTS

| CN | 102955612 A | 3/2013 |
| CN | 203149519 U | 8/2013 |
| CN | 103995612 A | 8/2014 |

OTHER PUBLICATIONS

Written Opinion of the International Searching Authority dated Feb. 3, 2015; PCT/CN2014/087596.
International Search Report dated Feb. 9, 2015; PCT/CN2014/087596.

*Primary Examiner* — Ibrahim Khan
(74) *Attorney, Agent, or Firm* — Ladas & Parry LLP

(57) ABSTRACT

A touch module, a manufacturing method thereof and a display device are disclosed. The touch module includes peripheral leads, an insulating layer and a touch electrode layer sequentially arranged on a substrate in stacked layers. The touch electrode layer includes touch sensing electrodes and touch drive electrodes, which intersect and are insulated from each other, and connection terminal protection members. Patterns of the touch sensing electrode and the touch drive electrode cover overlapping parts of the peripheral leads electrically connected with the touch sensing elec- (Continued)

trodes and the touch drive electrodes at positions of first opening areas of the insulating layer. Patterns of the connection terminal protection members cover connection terminal parts of corresponding peripheral leads at positions of second opening areas of the insulating layer. The touch module can simplify the number of layers of the touch module, reduce the use number of masks and improve the productivity.

18 Claims, 8 Drawing Sheets

(51) Int. Cl.
  *C23C 14/34* (2006.01)
  *C23C 14/58* (2006.01)
(52) U.S. Cl.
  CPC ............ *G06F 3/041* (2013.01); *G06F 3/0416* (2013.01); *G06F 2203/04103* (2013.01); *G06F 2203/04111* (2013.01)

(56) References Cited

U.S. PATENT DOCUMENTS

2013/0293790 A1    11/2013  Chang
2014/0340597 A1*   11/2014  Sato .................... G02F 1/13338
                                                     349/12

* cited by examiner

TOUCH MODULE, MANUFACTURING METHOD THEREOF AND DISPLAY DEVICE

TECHNICAL FIELD

At least one embodiment of the present invention relates to a touch module, a manufacturing method thereof and a display device.

BACKGROUND

With the rapid development of display technology, touch screen panels have been gradually widely applied in people's lives. Currently, in view of the working principle, the touch screen panels can be divided into: resistive type, capacitive type, infrared type, surface acoustic wave type, electromagnetic type, dispersive signal technology (DST) type, frustrated total internal reflection (FTIR) optical sensing type, etc. Capacitive touch panel has become a new star in the field due to the unique touch principle and the advantages of high sensitivity, long service life, high transmittance, etc.

In the currently widely applied one-glass-solution (OGS) touch module, a single-layer touch conductive film and sensors are directly formed on a substrate. As illustrated in FIGS. 1a and 1b, the OGS touch module mainly comprises: a substrate 01, a shield layer 02 (black matrix (BM)) for shielding peripheral leads, a touch electrode layer 03 provided with touch sensing electrodes 031 and touch drive electrodes 032 which intersect and are insulated from each other, an insulating layer (overcoat) 04, peripheral leads 05 for allowing electrodes in the touch electrode layer 03 to be connected to an IC chip, and an protection layer 06 for protecting the peripheral leads 05 from being affected by the environment and from being corroded and oxidized. The touch sensing electrodes 031 and the touch drive electrodes 032 are in diamond patterns or other patterns. Adjacent and mutually broken touch drive electrodes 032 or touch sensing electrodes 031 are connected with one other through bridge connectors 033. The touch sensing electrodes 031 and the touch drive electrodes 032 are connected with corresponding peripheral leads 05 in non-touch areas of the touch module. The peripheral leads 05 can input voltage signals to the touch electrode layer 03 and transmit the signals over the touch electrode layer 03 to corresponding IC chip for analysis and processing.

SUMMARY

At least one embodiment of the present invention provides a touch module, a manufacturing method thereof and a display device which are used for simplifying the layers of the touch module and improving the productivity.

At least one embodiment of the present invention provides a touch module, which comprises: peripheral leads, an insulating layer and a touch electrode layer sequentially arranged on a substrate in stacked layers. The touch electrode layer includes touch sensing electrodes and touch drive electrodes, which intersect and are insulated from each other, and connection terminal protection members; overlapping parts electrically connected with corresponding touch sensing electrodes or touch drive electrodes are disposed at one end of the peripheral leads, and connection terminal parts in one-to-one correspondence with the connection terminal protection members are disposed at the other end thereof; a pattern of the insulating layer is provided with first opening areas at positions corresponding to the overlapping parts of the peripheral leads and provided with second opening areas at positions corresponding to the connection terminal parts of the peripheral leads; patterns of the touch sensing electrode and the touch drive electrode cover the overlapping parts electrically connected with the touch sensing electrodes and the touch drive electrodes at the positions of the first opening areas; and patterns of the connection terminal protection members cover corresponding connection terminal parts at the positions of the second opening areas.

At least one embodiment of the present invention further provides a method for manufacturing a touch module. The method comprises: forming patterns of peripheral leads, each of which has an overlapping part disposed at one end and a connection terminal part is disposed at the other end, on a substrate; forming a pattern of an insulating layer, provided with first opening areas at positions corresponding to the overlapping parts of the peripheral leads and provided with second opening areas at positions corresponding to the connection terminal parts of the peripheral leads, on the pattern of the peripheral lead; and forming patterns of touch sensing electrodes and touch drive electrodes, which intersect and are insulated from each other, and patterns of connection terminal protection members in one-to-one correspondence with the connection terminal parts on the pattern of the insulating layer at the same time, wherein the patterns of the touch sensing electrodes and the touch drive electrodes cover the overlapping parts electrically connected with the touch sensing electrodes and the touch drive electrodes at the positions of the first opening areas, and the patterns of the connection terminal protection members cover corresponding connection terminal parts at the positions of the second opening areas.

At least one embodiment of the present invention provides a display device, which comprises the touch module provided by the embodiment of the present invention.

BRIEF DESCRIPTION OF THE DRAWINGS

Simple description will be given below to the accompanying drawings of the embodiments to provide a more clear understanding of the technical proposals of the embodiments of the present invention. Obviously, the drawings described below only involve some embodiments of the present invention but are not intended to limit the present invention.

DETAILED DESCRIPTION

For more clear understanding of the objectives, technical proposals and advantages of the embodiments of the present invention, clear and complete description will be given below to the technical proposals of the embodiments of the present invention with reference to the accompanying drawings of the embodiments of the present invention. Obviously, the preferred embodiments are only partial embodiments of the present invention but not all the embodiments.

All the other embodiments obtained by those skilled in the art without creative efforts on the basis of the embodiments of the present invention illustrated shall fall within the scope of protection of the present invention.

Figure 1A:
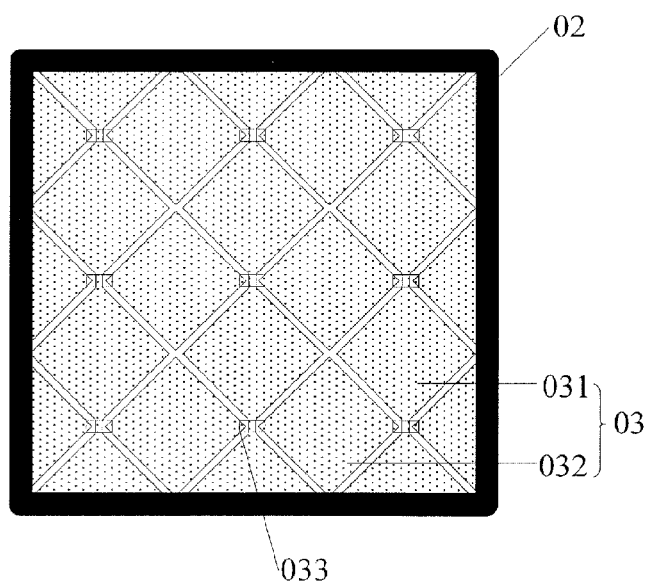
FIGS. 1a and 1b are respectively a schematic structural view of an OGS touch module.
Figure 1B:
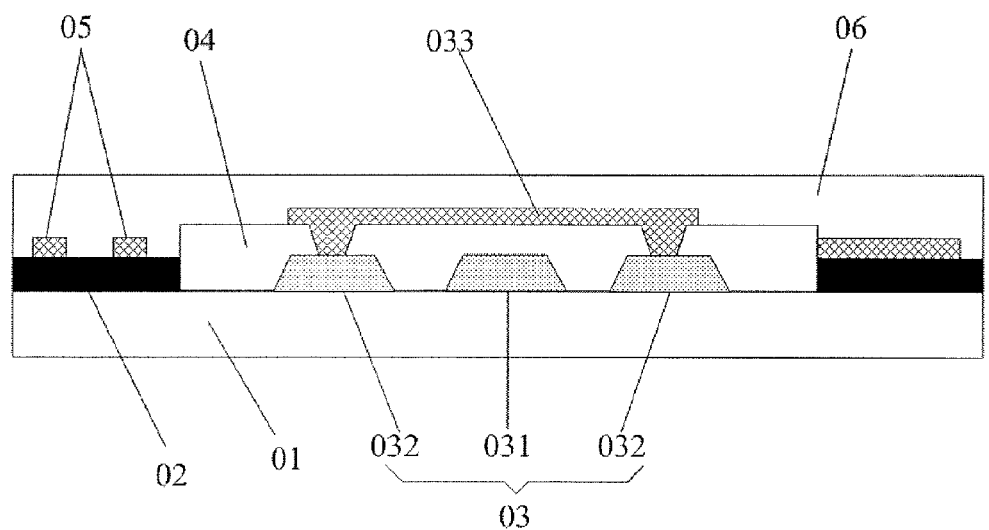

The inventors of the application have noted that: the OGS touch module as shown in FIGS. 1a and 1b comprises layers, so that the times of using masks are big, and hence the manufacturing process is relatively complex; and moreover, as each mask must be accurately aligned with respect to the substrate, the productivity is reduced and the manufacturing cost is increased.

Detailed description will be given below to the preferred embodiments of the touch module, the manufacturing method thereof and the display device, provided by the embodiment of the present invention, with reference to the accompanying drawings.

The thickness of layers and the size and the shape of areas in the accompanying drawings do not reflect the true scale of the touch module and are only intended to illustrate the content of the present invention.

Figure 2A:
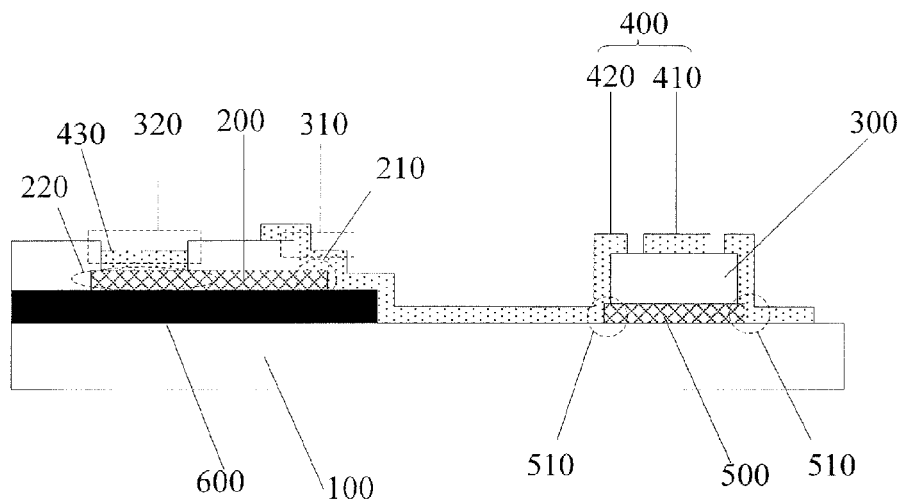
FIGS. 2a to 2e are respectively one schematic structural view of a touch module provided by an embodiment of the present invention.

At least one embodiment of the present invention provides a touch module, which, as illustrated in FIG. 2a, comprises: peripheral leads 200, an insulating layer 300 and a touch electrode layer 400, which are sequentially arranged on a substrate 100 in stacked layers.

Figure 2B:
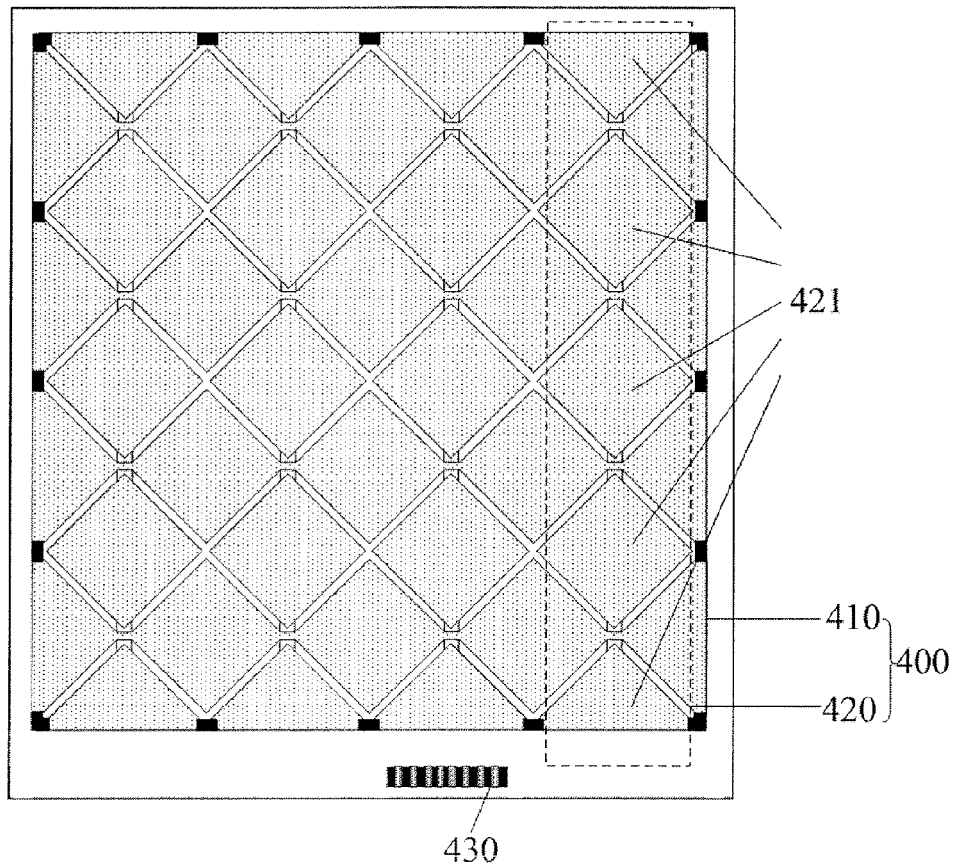

As illustrated in FIGS. 2a and 2b, the touch electrode layer 400 includes touch sensing electrodes 410 and touch drive electrodes 420, which intersect and are insulated from each other, and further comprises connection terminal protection members 430.

Figure 2C:
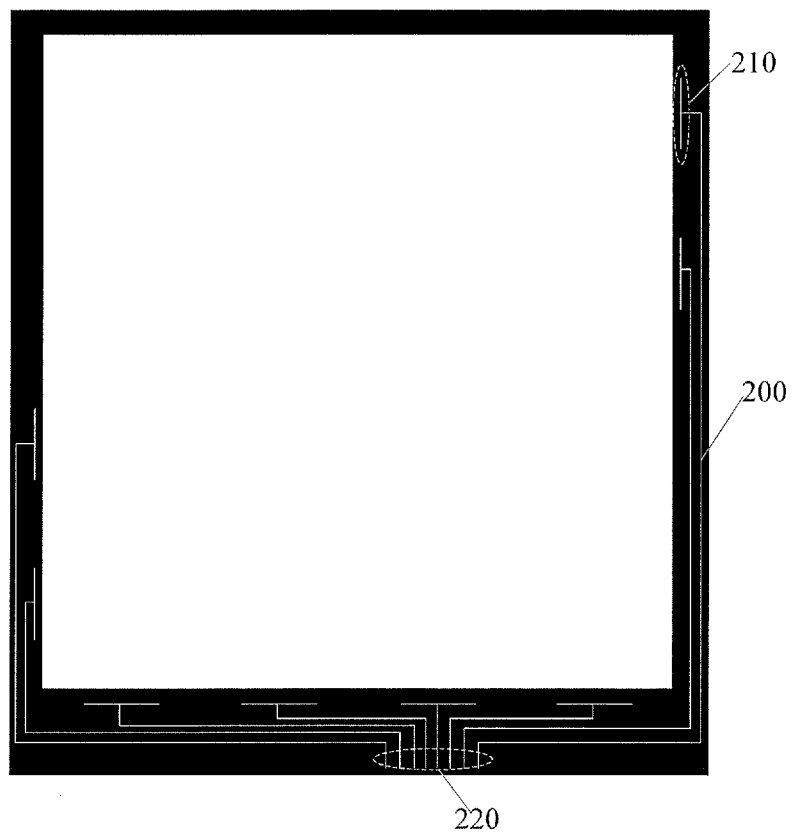

As illustrated in FIGS. 2a and 2c, an overlapping part 210 electrically connected with corresponding touch sensing electrode 410 or touch drive electrode 420 is provided at one end of the peripheral lead 200, and a connection terminal part 220 in one-to-one correspondence with the connection terminal protection member 430 is provided at the other end.

Figure 2D:
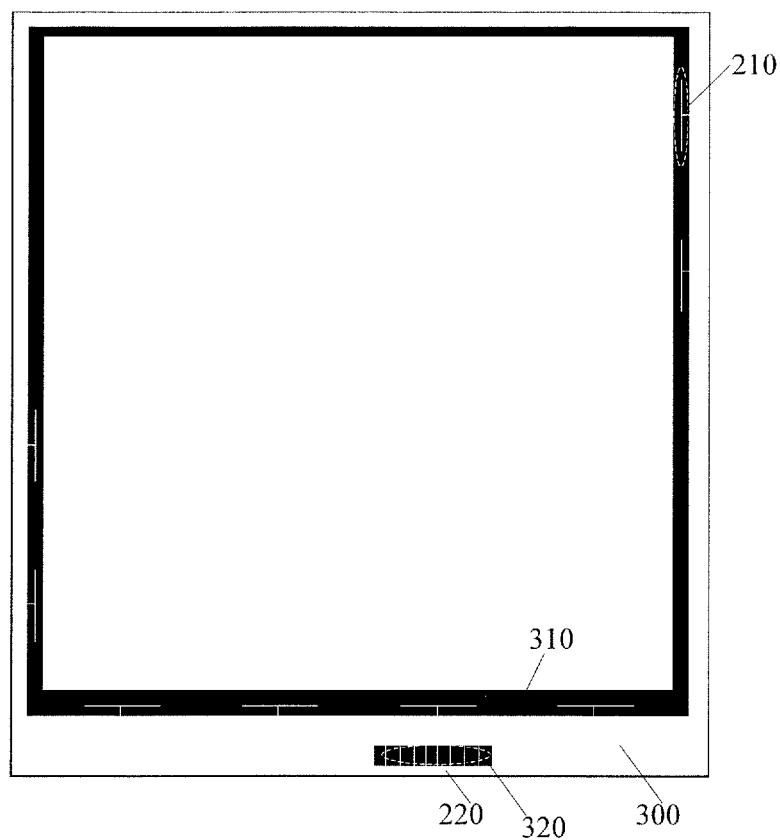

As illustrated in FIGS. 2a and 2d, the pattern of the insulating layer 300 is provided with first opening areas 310 at positions corresponding to the overlapping parts 210 of the peripheral leads 200 and provided with second opening areas 320 at positions corresponding to the connection terminal parts 220 of the peripheral leads 200.

As illustrated in FIG. 2a, patterns of the touch sensing electrode 410 and the touch drive electrode 420 cover an overlapping part 210 electrically connected with the touch sensing electrode 410 and the touch drive electrode 420 at the position of a first opening area 310.

As illustrated in FIG. 2a, the pattern of the connection terminal protection member 430 covers a corresponding connection terminal part 220 at the position of a second opening area 320.

In the touch screen panel, the peripheral leads 200 are generally metal wirings. As the resistance of a metal is relatively low, the conductivity is better, and hence the touch sensitivity of the touch module can be improved. For instance, the peripheral leads 200 may be made of molybdenum (Mo) or aluminum (Al). But as the peripheral leads 200 made of a metal may be easily corroded and oxidized if contacting with the external environment, a protection layer (overcoat) must be independently arranged on the peripheral leads 200. The arrangement of the protection layer will increase the number of layers of the touch module.

On this basis, in the touch module provided by the embodiment of the present invention, the insulating layer 300 and the touch electrode layer 400 are arranged on the peripheral leads 200 in sequence; the touch sensing electrode 410 and the touch drive electrode 420 cover the overlapping part 210 of a corresponding peripheral lead 200; the connection terminal protection member 430 covers the connection terminal part 220 of the corresponding peripheral lead 200; and the insulating layer 300 covers areas of the peripheral lead 200 other than the overlapping part 210 and the connection terminal part 220. In one aspect, in the embodiment of the present invention, by adoption of the above-described configuration to cover a peripheral lead 200, the situation that the peripheral leads 200 contact with the external environment can be avoided, so that the peripheral leads 200 cannot be affected by the environment and prevented from being corroded and oxidized, and an independently arranged protection layer is not required any more, which can simplify the number of layers of the touch module, reduce the application times of masks and improve the productivity. In another aspect, by adoption of the above-described configuration to cover the peripheral leads 200, the touch module provided by the embodiment of the present invention can avoid the damage to the peripheral leads due to the phenomenon that the etching liquid in the process of forming the pattern of the touch electrode layer 400 erodes the underlying peripheral leads 200.

In a specific implementation example, in the touch screen panel provided by the embodiment of the present invention, as the touch drive electrodes 420 and the touch sensing electrodes 410 in the touch electrode layer 400 are arranged in the same layer, the configuration that the touch sensing electrodes 410 or the touch drive electrodes 420 are disconnected may occur. Therefore, as illustrated in FIG. 2a, the touch sensing electrodes 410 or the touch drive electrodes 420 each must be connected with each other through bridge connectors 500.

In one embodiment, as illustrated in FIG. 2b, each touch drive electrode 420 may include a plurality of mutually independent touch drive sub-electrodes 421 arranged along the extension direction of the touch drive electrode 420, and the touch drive sub-electrodes 421 of the touch drive electrode 420 are electrically connected with one another in order through the bridge connectors 500.

Figure 2E:
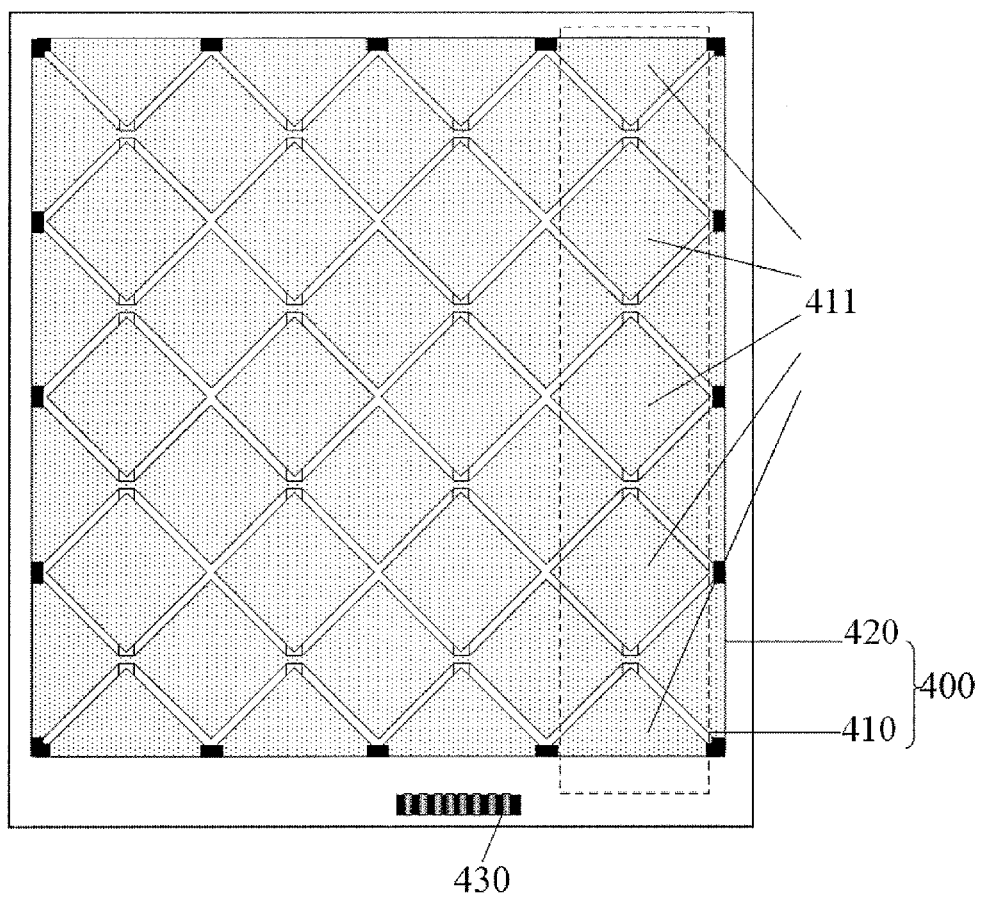

Or in one embodiment, as illustrated in FIG. 2e, each touch sensing electrode 410 includes a plurality of mutually independent touch sensing sub-electrodes 411 arranged along the extension direction of the touch sensing electrode 410, and the touch sensing sub-electrodes 411 of the touch sensing electrode 410 are electrically connected with one another in order through the bridge connectors 500.

For instance, in the touch module provided by the embodiment of the present invention, the touch sensing electrodes 410 and the touch drive electrodes 420 may be made of a transparent conductive material such as indium tin oxide (ITO), indium zinc oxide (IZO), carbon nano-tube, graphene or the like.

For instance, in the touch module provided by the embodiment of the present invention, the bridge connectors 500 may be made of a transparent conductive material such as ITO, IZO, carbon nano-tube, graphene or the like. At this point, an independent mask must be adopted to manufacture the bridge connectors 500. In one embodiment, the bridge connectors 500 may be disposed between a layer provided with the peripheral lead 200 and the substrate 100, namely a pattern of the bridge connectors 500 is formed before the peripheral lead 200 is formed, which can avoid the phenomenon in which the etching liquid in the process of forming the bridge connector 500 erodes the underlying peripheral lead 200.

Figure 3A:
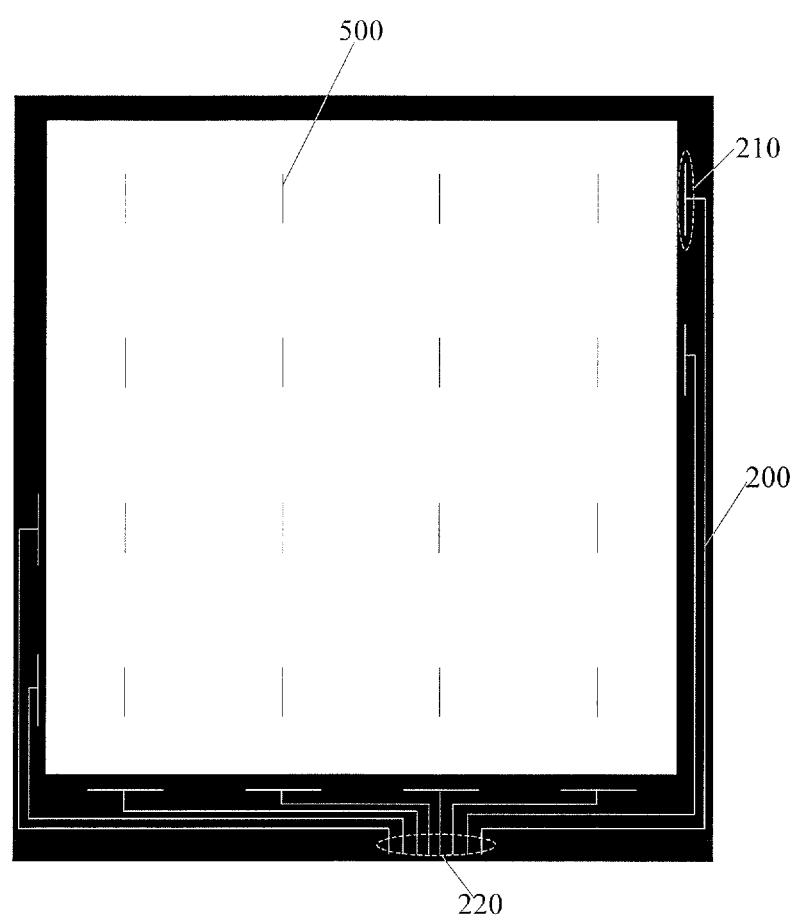
FIGS. 3a to 3c are respectively another schematic structural view of the touch module provided by an embodiment of the present invention.

Or in the touch module provided by the embodiment of the present invention, the bridge connectors 500 may also be made from a metal. At this point, in order to save the manufacturing process, in one embodiment, as illustrated in FIG. 3a, the bridge connectors 500 and the peripheral leads 200 may be arranged in the same layer, namely the patterns of the bridge connectors 500 and those of the peripheral leads 200 are formed at the same time in one patterning process.

When the bridge connectors 500 are made of ITO, the transmittance of the touch module can be improved; and the light reflectivity of the ITO is lower than that of a metal, so that the influence of reflected light on the human vision can be reduced as well. When the bridge connectors 500 are made of a metal, the bridge connectors 500 and the peripheral leads 200 may be arranged in the same layer, so that the process can be simplified; and as the resistance of a metal is lower than that of the ITO, the resistance of the touch electrode layer 400 can be reduced, and hence the touch sensitivity can be improved. But as a metal is generally light-tight, the transmittance of the touch module can be affected. On this basis, the material of the bridge connectors 500 may be selected according to the actual production needs. No limitation will be given here.

Figure 3B:
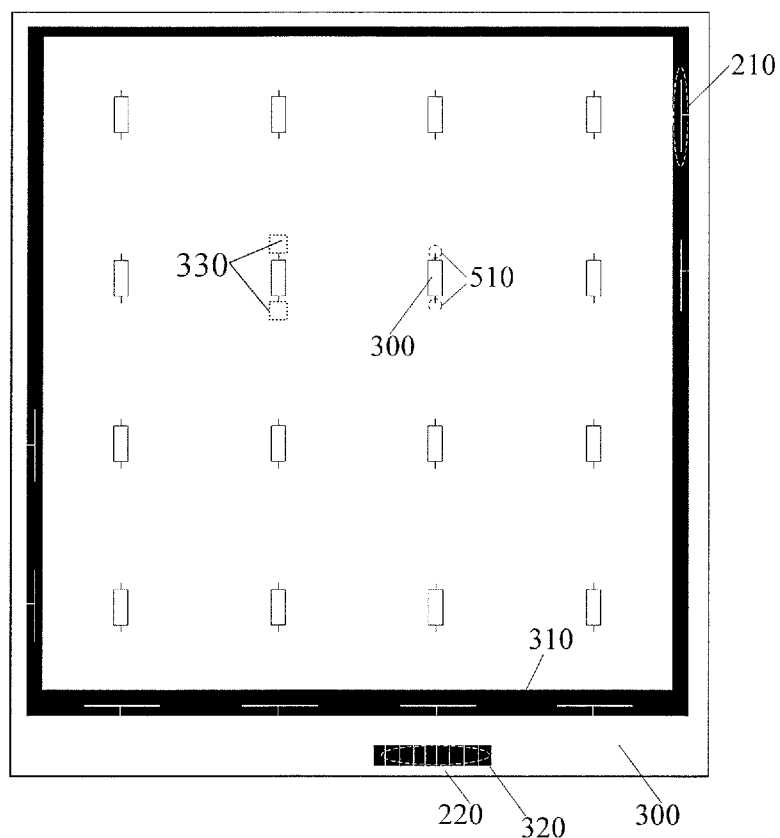

No matter the case that the bridge connectors 500 are made of a metal and the bridge connectors 500 and the peripheral lead 200 are arranged in the same layer or the case that the bridge connectors 500 are made of ITO and disposed between the layer provided with the peripheral lead 200 and the substrate 100, in order to avoid the corrosion to the underlying bridge connectors 500 by the etching liquid in the process of forming the pattern of the touch electrode layer 400, in one embodiment, as illustrated in FIG. 3b, as for the connecting parts 510 electrically connected with corresponding touch sensing sub-electrodes or touch drive sub-electrodes and respectively arranged at both ends of the bridge connectors 500, the pattern of the insulating layer 300 is provided with third opening areas 330 at positions corresponding to the connecting parts 510 of the bridge connectors 500, namely the pattern of the insulating layer may cover the areas of the bridge connectors 500 other than the connecting parts 510; and as illustrated in FIG. 2a, as for the connecting parts 510 of a bridge connector 500, a pattern of the touch sensing electrode 410 or the touch drive electrode 420 covers the connecting part 510 electrically connected with the touch sensing electrode 410 or the touch drive electrode 420 at the position of the third opening area 330, namely patterns of the touch sensing sub-electrodes or the touch drive sub-electrodes cover the connecting parts electrically connected with the touch sensing sub-electrodes or the touch drive sub-electrodes at the positions of the third opening areas 330.

In one embodiment, the touch module provided by the embodiment of the present invention, as illustrated in FIG. 2a, may further comprise: a shield layer 600 for shielding the peripheral leads 200. The shield layer 600 may be made of a black photosensitive resin material. In this case, the black photosensitive resin material may be used as photoresist in the mask process as well. Therefore, the process of independently coating the photoresist can be saved; the usage amount of the photoresist can be reduced; and the manufacturing cost can be reduced.

In one embodiment, the shield layer 600 may be disposed between the peripheral leads 200 and the substrate 100, namely the pattern of the shield layer 600 may be formed on the substrate 100 first, and then other layers are formed.

Based on the same inventive concept, at least one embodiment of the present invention further provides a method for manufacturing a touch module. The embodiments of the method may refer to the embodiments of the touch module. No further description will be given here.

Figure 4:
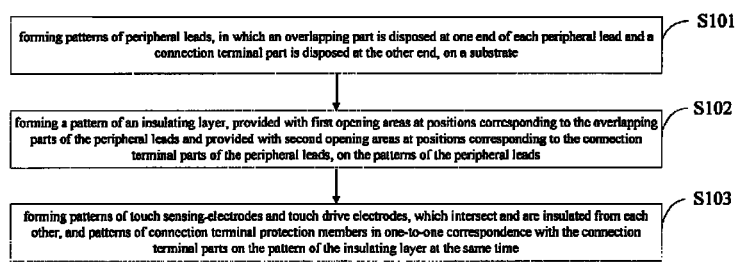
FIG. 4 is a flowchart of a method for manufacturing a touch module, provided by an embodiment of the present invention.

For instance, a method for manufacturing a touch module, provided by at least one embodiment of the present invention, as illustrated in FIG. 4, comprises the following steps.

S101: forming patterns of peripheral leads, in which an overlapping part is disposed at one end of each peripheral lead and a connection terminal part is disposed at the other end, on a substrate.

S102: forming a pattern of an insulating layer, provided with first opening areas at positions corresponding to the overlapping parts of the peripheral leads and provided with second opening areas at positions corresponding to the connection terminal parts of the peripheral leads, on the patterns of the peripheral leads.

S103: forming patterns of touch sensing electrodes and touch drive electrodes, which intersect and are insulated from each other, and patterns of connection terminal protection members in one-to-one correspondence with the connection terminal parts on the pattern of the insulating layer at the same time, in which the patterns of the touch sensing electrodes and the touch drive electrodes cover the overlapping parts electrically connected with the touch sensing electrodes and the touch drive electrodes at the positions of the first opening areas, and the patterns of the connection terminal protection members cover corresponding connection terminal parts at the positions of the second opening areas.

In a different embodiment, in the step S103, the pattern of each touch drive electrode includes patterns of a plurality of mutually independent touch drive sub-electrodes arranged along the extension direction of the touch drive electrode, and the method provided by the embodiment of the present invention further comprises: forming patterns of bridge connectors for electrically connecting the touch drive sub-electrodes in the touch drive electrode. Or in the step S103, the pattern of each touch sensing electrode includes patterns of a plurality of mutually independent touch sensing sub-electrodes arranged along the extension direction of the touch sensing electrode, and the method provided by the embodiment of the present invention further comprises: forming patterns of bridge connectors for electrically connecting the touch sensing sub-electrodes in the touch sensing electrode.

For instance, in the method provided by the embodiment of the present invention, the patterns of the bridge connectors may be formed at the same time when the patterns of the peripheral leads are formed in the step S102; or the the patterns of the bridge connectors may be formed before the patterns of the peripheral leads are formed in the step S102.

For instance, in the method provided by the embodiment of the present invention, connecting parts electrically connected with corresponding touch sensing sub-electrode or touch drive sub-electrode are respectively arranged at both ends of each bridge connector; the pattern of the insulating layer formed in the step S102 is also provided with third opening areas at positions corresponding to the connecting parts of the bridge connectors; and the patterns of the touch sensing sub-electrodes or the touch drive sub-electrodes formed in the step S103 cover the connecting parts electrically connected with the touch sensing sub-electrodes or the touch drive sub-electrodes at the positions of the third opening areas.

For instance, the method provided by the embodiment of the present invention may further comprise: forming a pattern of a shield layer for shielding the peripheral leads.

For instance, the step of forming the pattern of the shield layer may include: forming the pattern of the shield layer on the substrate before the patterns of the peripheral leads are formed.

The method for manufacturing the touch module, provided by an embodiment of the present invention, will be described below by respectively taking the case that the bridge connectors is made of a metal as an example and taking the case that the bridge connector is made of ITO as an example.

Embodiment 1: Forming Bridge Connectors with Metal.

Figure 3C:
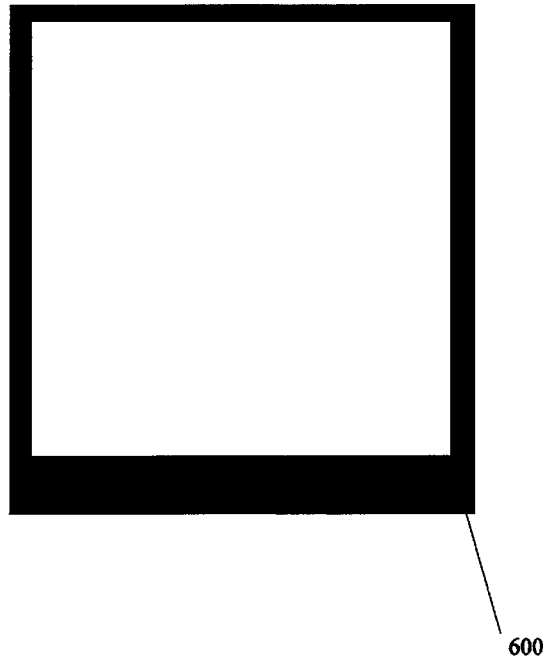

The process of manufacturing the touch module, for instance, may comprise the following steps:

Step 1: forming a pattern of a shield layer 600 on a substrate 100, as shown in FIG. 3*c*.

In a specific implementation example, for instance, a black photosensitive resin as photoresist can be coated on the substrate 100 by spin coating, and the pattern of the shield layer 600 is formed after exposure, development and post-baking treatment.

Step 2: forming patterns of bridge connectors 500 and peripheral leads 200 on the layer provided with the shield layer 600.

In a specific implementation example, a layer made of a metallic material may be deposited on the substrate 100 by sputtering, and subsequently, photoresist is coated on the layer made of the metallic material, then subjected to exposure, development and etching processes, and stripped off to form the patterns of the bridge connectors 500 and the peripheral leads 200. For instance, the metallic material may be Mo or Al.

Step 3: forming a pattern of an insulating layer 300 on the bridge connectors 500 and the peripheral leads 200, as shown in FIG. 3*b*. Moreover, the pattern of the insulating layer 300 is provided with first opening areas 310 at positions corresponding to overlapping parts 210 of the peripheral leads 200, provided with second opening areas 320 at positions corresponding to connection terminal parts 220 of the peripheral leads 200, and provided with third opening areas at positions corresponding to connecting parts 510 of the bridge connectors 500. That is to say, the pattern of the insulating layer does not have portions in the first opening areas 310, the second opening areas 320 and the third opening areas.

Step 4: forming a pattern of a touch electrode layer 400 on the insulating layer 300. The pattern of the touch electrode layer may includes: patterns of touch sensing electrodes 410 and touch drive electrodes 420 which intersect and are insulated from each other, and patterns of connection terminal protection members 430, as shown in FIG. 2*b*.

The patterns of the touch sensing electrodes 410 and the touch drive electrodes 420 cover the overlapping parts 210 electrically connected with the touch sensing electrodes 410 and the touch drive electrodes 420 at the positions of the first opening areas 310, and cover and protect the connecting parts 510 electrically connected with the touch sensing electrodes 410 and the touch drive electrodes 420 at the position of the third opening areas 330; and the pattern of the connection terminal protection members 430 cover and protect corresponding connection terminal parts 220 at the positions of the second opening areas 320.

In summary, the touch module as shown in FIG. 2*b*, provided by the embodiment of the present invention, can be obtained after the steps 1 to 4. Moreover, as can be seen, four patterning processes are adopted in total in the manufacturing process in the embodiment 1.

Embodiment 2: Forming the Bridge Connectors with ITO

The most manufacturing processes of the embodiment 2 are the same with those of the embodiment 1. No further description will be given here. Only different manufacturing processes are described blow.

As different from the step 2 in the embodiment 1, in the embodiment 2, the patterns of the bridge connectors 500 are formed on the layer provided with the shield layer 600 at first, and then the patterns of the peripheral leads 200 are formed on the layer provided with the bridge connectors 500. As can be seen, one patterning process is added in the manufacturing process in the embodiment 2 compared with the embodiment 1.

Based on the same inventive concept, at least one embodiment of the present invention further provides a display device, which comprises the touch module provided by the embodiment of the present invention. The display device may be any product or component with display function such as a mobile phone, a tablet PC, a television (TV), a display, a notebook computer, a digital picture frame and a navigator. The embodiments of the display device may refer to the embodiments of the touch module. No further description will be given here.

In the touch module, the manufacturing method thereof and the display device, provided by the embodiment of the present invention, an insulating layer and a touch electrode layer are arranged on the peripheral leads in sequence; the touch sensing electrodes and the touch drive electrodes cover the overlapping part of corresponding peripheral leads; the connection terminal protection member cover the connection terminal parts of corresponding peripheral leads; and the insulating layer covers areas of the peripheral leads other than the overlapping parts and the connection terminal parts. In one aspect, in the embodiment of the present invention, by adoption of the above configurations to cover the peripheral leads, the phenomenon that the peripheral leads contact with the external environment can be avoided, so that the peripheral leads cannot be affected by the environment and prevented from being corroded and oxidized and also an independently arranged protection layer is not required, which can simplify the number of layers of the touch module, reduce the use frequency of masks and improve the productivity. In another aspect, by adoption of the above configurations to cover the peripheral leads, the embodiment of the present invention can avoid the damage of the peripheral leads due to the phenomenon that an etching liquid in the process of forming the pattern of the touch electrode layer erodes the underlying peripheral leads.

Obviously, various modifications and deformations can be made to the present invention by those skilled in the art without departing from the spirit and scope of the present invention. Therefore, if the modifications and deformations of the present invention fall within the scope of the appended claims of the present invention and equivalents thereof, the present invention is also intended to include the modifications and deformations.

The application claims priority to the Chinese patent application No. 201410191600.0, filed May 7, 2014, the entire disclosure of which is incorporated herein by reference as part of the application.

The invention claimed is:

1. A touch module, comprising: peripheral leads, an insulating layer and a touch electrode layer sequentially arranged on a substrate in stacked layers, wherein the touch electrode layer includes touch sensing electrodes and touch drive electrodes, which intersect and are insulated from each other, and connection terminal protection members;

overlapping parts electrically connected with corresponding touch sensing electrodes or touch drive electrodes are disposed at one end of the peripheral leads, and connection terminal parts in one-to-one correspondence with the connection terminal protection members are disposed at the other end thereof;

the connection terminal parts are made of a metal material, and the connection terminal protection members are made of a transparent conductive material;

a pattern of the insulating layer is provided with first opening areas at positions corresponding to the overlapping parts of the peripheral leads and provided with second opening areas at positions corresponding to the connection terminal parts of the peripheral leads;

patterns of the touch sensing electrode and the touch drive electrode cover the overlapping parts electrically connected with the touch sensing electrodes and the touch drive electrodes at the positions of the first opening areas; and patterns of the connection terminal parts are exposed at the second opening areas, and patterns of the connection terminal protection members cover only the corresponding connection terminal parts exposed at the second opening areas.

2. The touch module according to claim 1, wherein each touch drive electrode includes a plurality of mutually independent touch drive sub-electrodes arranged along an extension direction of the touch drive electrode, and the touch drive sub-electrodes of the touch drive electrode are electrically connected with one another in order through bridge connectors; or each touch sensing electrode includes a plurality of mutually independent touch sensing sub-electrodes arranged along an extension direction of the touch sensing electrode, and the touch sensing sub-electrodes in the touch sensing electrode are electrically connected with one another in order through bridge connectors.

3. The touch module according to claim 2, wherein the bridge connectors and the peripheral leads are arranged in a same layer; or the bridge connectors are disposed between the substrate and a layer provided with the peripheral leads.

4. The touch module according to claim 3, wherein connecting parts electrically connected with corresponding touch sensing sub-electrodes or touch drive sub-electrodes are respectively disposed at both ends of the bridge connectors;

the pattern of the insulating layer is provided with third opening areas at positions corresponding to the connecting parts of the bridge connectors; and patterns of the touch sensing sub-electrodes or the touch drive sub-electrodes cover the connecting parts electrically connected with the touch sensing sub-electrodes or the touch drive sub-electrodes at the positions of the third opening areas.

5. The touch module according to claim 2, wherein connecting parts electrically connected with corresponding touch sensing sub-electrodes or touch drive sub-electrodes are respectively disposed at both ends of the bridge connectors;

the pattern of the insulating layer is provided with third opening areas at positions corresponding to the connecting parts of the bridge connectors; and patterns of the touch sensing sub-electrodes or the touch drive sub-electrodes cover the connecting parts electrically connected with the touch sensing sub-electrodes or the touch drive sub-electrodes at the positions of the third opening areas.

6. The touch module according to claim 2, further comprising a shield layer for shielding the peripheral leads.

7. The touch module according to claim 6, wherein the shield layer is disposed between the peripheral leads and the substrate.

8. The touch module according to claim 1, further comprising a shield layer for shielding the peripheral leads.

9. The touch module according to claim 8, wherein the shield layer is disposed between the peripheral leads and the substrate.

10. A display device, comprising the touch module according to claim 1.

11. A method for manufacturing a touch module, comprising:

forming patterns of peripheral leads, each of which has an overlapping part disposed at one end and a connection terminal part is disposed at the other end, on a substrate;

forming a pattern of an insulating layer, provided with first opening areas at positions corresponding to the overlapping parts of the peripheral leads and provided with second opening areas at positions corresponding to the connection terminal parts of the peripheral leads, on the pattern of the peripheral lead; and forming patterns of touch sensing electrodes and touch drive electrodes, which intersect and are insulated from each other, and patterns of connection terminal protection members in one-to-one correspondence with the connection terminal parts on the pattern of the insulating layer at the same time, wherein the connection terminal parts ate made of a metal material and the connection terminal protection members are made of a transparent conductive material, the patterns of the touch sensing electrodes and the touch drive electrodes cover the overlapping parts electrically connected with the touch sensing electrodes and the touch drive electrodes at the positions of the first opening areas, patterns of the connection terminal parts are exposed at the second opening areas, and the patterns of the connection terminal protection members cover only the corresponding connection terminal parts exposed at the second opening areas.

12. The method according to claim 11, wherein the pattern of each touch drive electrode includes patterns of a plurality of mutually independent touch drive sub-electrodes arranged along an extension direction of the touch drive electrode, and the method further comprises: forming patterns of bridge connectors for electrically connecting the touch drive sub-electrodes of the touch drive electrode; or the pattern of each touch sensing electrode includes patterns of a plurality of mutually independent touch sensing sub-electrodes arranged along an extension direction of the touch sensing electrode, and the method further comprises: forming patterns of bridge connectors for electrically connecting the touch sensing sub-electrodes of the touch sensing electrode.

13. The method according to claim 12, wherein the patterns of the bridge connectors are formed at the same time when the patterns of the peripheral leads are formed; or the patterns of the bridge connectors are formed before the patterns of the peripheral leads are formed.

14. The method according to claim 13, wherein connecting parts electrically connected with corresponding touch sensing sub-electrodes or touch drive sub-electrodes are respectively disposed at both ends of the bridge connectors;
- the formed pattern of the insulating layer is provided with third opening areas at positions corresponding to the connecting parts of the bridge connectors; and
- the formed patterns of the touch sensing sub-electrodes or the touch drive sub-electrodes cover the connecting parts electrically connected with the touch sensing sub-electrodes or the touch drive sub-electrodes at the positions of the third opening areas.

15. The method according to claim 12, wherein connecting parts electrically connected with corresponding touch sensing sub-electrodes or touch drive sub-electrodes are respectively disposed at both ends of the bridge connectors;
- the formed pattern of the Insulating layer is provided with third opening areas at positions corresponding to the connecting parts of the bridge connectors; and
- the formed patterns of the touch sensing sub-electrodes or the touch drive sub-electrodes cover the connecting parts electrically connected with the touch sensing sub-electrodes or the touch drive sub-electrodes at the positions of the third opening areas.

16. The method according to claim 12, further comprising:
- forming a pattern of a shield layer for shielding the peripheral leads.

17. The method according to claim 11, further comprising:
- forming a pattern of a shield layer for shielding the peripheral leads.

18. The method according to claim 17, wherein the pattern of the shield layer is formed on the substrate before the patterns of the peripheral leads are formed.

* * * * *